United States Patent
Markham et al.

(10) Patent No.: US 10,883,194 B2
(45) Date of Patent: Jan. 5, 2021

(54) DIAMOND COMPONENTS FOR QUANTUM IMAGING, SENSING AND INFORMATION PROCESSING DEVICES

(71) Applicant: Element Six Technologies Limited, Oxfordshire (GB)

(72) Inventors: Matthew Markham, Oxfordshire (GB); Alastair Stacey, Oxfordshire (GB); Daniel Twitchen, Oxfordshire (GB)

(73) Assignee: ELEMENT SIX TECHNOLOGIES LIMITED, Oxfordshire (GB)

( * ) Notice: Subject to any disclaimer, the term of this patent is extended or adjusted under 35 U.S.C. 154(b) by 725 days.

(21) Appl. No.: 15/036,617

(22) PCT Filed: Nov. 18, 2014

(86) PCT No.: PCT/EP2014/074869
§ 371 (c)(1),
(2) Date: May 13, 2016

(87) PCT Pub. No.: WO2015/071487
PCT Pub. Date: May 21, 2015

(65) Prior Publication Data
US 2016/0348277 A1 Dec. 1, 2016

(30) Foreign Application Priority Data
Nov. 18, 2013 (GB) .................. 1320302.1

(51) Int. Cl.
*C30B 31/22* (2006.01)
*C30B 25/20* (2006.01)
(Continued)

(52) U.S. Cl.
CPC ............ *C30B 31/22* (2013.01); *C30B 25/186* (2013.01); *C30B 25/20* (2013.01); *C30B 25/205* (2013.01);
(Continued)

(58) Field of Classification Search
CPC ..... C30B 31/22; C30B 29/04; H01L 29/1602; H01L 21/042
See application file for complete search history.

(56) References Cited

U.S. PATENT DOCUMENTS

| 2005/0029095 A1* | 2/2005 | Hall ............. G01N 27/308 204/400 |
| 2010/0116197 A1* | 5/2010 | Godfried ............ C30B 25/02 117/89 |
| 2011/0163291 A1 | 7/2011 | Scarsbrook et al. |

FOREIGN PATENT DOCUMENTS

| GB | 2490589 A | 11/2012 |
| WO | 2001096633 A1 | 12/2001 |

(Continued)

OTHER PUBLICATIONS

Steinert S. et al. "High Sensitivity Magnetic Imaging Using an Array of Spins in Diamond," Review of Scientific Instruments, 81, 043705 (2010).

(Continued)

*Primary Examiner* — Laura A Auer
(74) *Attorney, Agent, or Firm* — Armstrong Teasdale LLP

(57) ABSTRACT

A single crystal CVD diamond component comprising: a surface, wherein at least a portion of said surface is formed of as-grown growth face single crystal CVD diamond material which has not been polished or etched and which has a surface roughness $R_a$ of no more than 100 nm; and a layer of $NV^-$ defects, said layer of $NV^-$ defects being disposed within 1 μm of the surface, said layer of $NV^-$ defects having a thickness of no more than 500 nm, and said layer of $NV^-$ defects having a concentration of $NV^-$ defects of at least $10^5$ $NV^-/cm^2$.

18 Claims, 3 Drawing Sheets

(A)

(B)

(51) Int. Cl.
  *C30B 29/04* (2006.01)
  *C30B 29/68* (2006.01)
  *H01L 21/04* (2006.01)
  *H01L 29/16* (2006.01)
  *C30B 25/18* (2006.01)

(52) U.S. Cl.
  CPC .............. *C30B 29/04* (2013.01); *C30B 29/68* (2013.01); *H01L 21/042* (2013.01); *H01L 29/1602* (2013.01)

(56) References Cited

FOREIGN PATENT DOCUMENTS

| WO | 2010010344 A1 | 1/2010 |
| WO | 2010010352 A1 | 1/2010 |
| WO | 2012152617 A1 | 11/2012 |
| WO | 2012159896 A1 | 11/2012 |

OTHER PUBLICATIONS

Rabeau J.R. et al. "Implantation of Labelled Single Nitrogen Vacancy Centres in Diamond Using 15N," Applied Physics Letters, 88, 023113 (2006).

Pezzagna S. et al., "Creation and nature of optical centres in diamond for single-photon emission-overview and critical remarks," New Journal of Physics, 13, 035024 (2011).

Gomi T. et al. "Position and Density Control of Nitrogen-vacancy Centers in Diamond Using Micropatterned Substrate for Chemical Vapor Deposition," in CLEO: 2013, OSA Technical Digest (online) (Optical Society of America, 2013), paper JTh2A.36.

Ri S.-G. et al. "Misorientation angle dependence of surface morphology in homoepitaxial diamond film growth at a low CH4/H2 ratio", Journal of Crystal Growth, 235(1-4): 300-306 (2002).

Santori C. et al. "Vertical distribution of nitrogen-vacancy centers in diamond formed by ion implantation and annealing", Physical Review B, 79, 125313 (2009).

Fu K.-M. et al. "Conversion of neutral nitrogen-vacancy centers to negatively charged nitrogen-vacancy centers through selective oxidation", Applied Physics Letters, 96, 121907 (2010).

Naydenov B. et al. "Increasing the coherence time of single electron spins in diamond by high temperature annealing", Applied Physics Letters, 97, 242511 (2010).

International Search Report issued for Application Serial No. PCT/EP2014/074869 dated Jan. 8, 2015.

Written Opinion issued for Application Serial. No. PCT/EP2014/074869 dated Jan. 8, 2015.

\* cited by examiner (A)

(B)

DIAMOND COMPONENTS FOR QUANTUM IMAGING, SENSING AND INFORMATION PROCESSING DEVICES

CROSS-REFERENCE TO RELATED APPLICATIONS

This application is a National Stage of International Application No. PCT/EP2014/074869, filed Nov. 18, 2014, which claims priority to GB1320302.1, filed Nov. 18, 2013.

FIELD OF INVENTION

The present invention relates to diamond components for quantum imaging, sensing, and information processing devices and to methods of fabricating single crystal chemical vapour deposited (CVD) diamond components for use in quantum imaging, sensing, and information processing applications.

BACKGROUND OF INVENTION

Point defects in synthetic diamond material, particularly quantum spin defects and/or optically active defects, have been proposed for use in various imaging, sensing, and processing applications including: luminescent tags; magnetometers; spin resonance devices such as nuclear magnetic resonance (NMR) and electron spin resonance (ESR) devices; spin resonance imaging devices for magnetic resonance imaging (MRI); and quantum information processing devices such as for quantum communication and computing.

Many point defects have been studied in synthetic diamond material including: silicon containing defects such as silicon-vacancy defects (Si—V), silicon di-vacancy defects (Si—V$_2$), silicon-vacancy-hydrogen defects (Si—V:H), silicon di-vacancy hydrogen defects (S—V$_2$:H); nickel containing defect; chromium containing defects; and nitrogen containing defects such as nitrogen-vacancy defects (N—V), di-nitrogen vacancy defects (N—V—N), and nitrogen-vacancy-hydrogen defects (N—V—H). These defects are typically found in a neutral charge state or in a negative charge state. It will be noted that these point defects extend over more than one crystal lattice point. The term point defect as used herein is intended to encompass such defects but not include larger cluster defects, such as those extending over ten or more lattice points, or extended defects such as dislocations which may extend over many lattice points.

It has been found that certain defects are particularly useful for sensing and quantum processing applications when in their negative charge state. For example, the negatively charged nitrogen-vacancy defect (NV$^-$) in synthetic diamond material has attracted a lot of interest as a useful quantum spin defect because it has several desirable features including:

(i) Its electron spin states can be coherently manipulated with high fidelity and have an extremely long coherence time (which may be quantified and compared using the transverse relaxation time $T_2$ and/or $T_2^*$);

(ii) Its electronic structure allows the defect to be optically pumped into its electronic ground state allowing such defects to be placed into a specific electronic spin state even at non-cryogenic temperatures. This can negate the requirement for expensive and bulky cryogenic cooling apparatus for certain applications where miniaturization is desired. Furthermore, the defect can function as a source of photons which all have the same spin state; and (iii) Its electronic structure comprises emissive and non-emissive electron spin states which allows the electron spin state of the defect to be read out through photons. This is convenient for reading out information from synthetic diamond material used in sensing applications such as magnetometry, spin resonance spectroscopy, and imaging. Furthermore, it is a key ingredient towards using the NV$^-$ defects as qubits for long-distance quantum communications and scalable quantum computation. Such results make the NV$^-$ defect a competitive candidate for solid-state quantum information processing (QIP).

The NV$^-$ defect in diamond consists of a substitutional nitrogen atom adjacent to a carbon vacancy. Its two unpaired electrons form a spin triplet in the electronic ground state ($^3$A), the degenerate $m_s=\pm 1$ sublevels being separated from the $m_s=0$ level by 2.87 GHz. The electronic structure of the NV$^-$ defect is such that the $m_s=0$ sublevel exhibits a high fluorescence rate when optically pumped. In contrast, when the defect is excited in the $m_s=\pm 1$ levels, it exhibits a higher probability to cross over to the non-radiative singlet state ($^1$A) followed by a subsequent relaxation into $m_s=0$. As a result, the spin state can be optically read out, the $m_s=0$ state being "bright" and the $m_s=\pm 1$ states being dark. When an external magnetic field is applied, the degeneracy of the spin sublevels $m_s=\pm 1$ is broken via Zeeman splitting. This causes the resonance lines to split depending on the applied magnetic field magnitude and its direction. This dependency can be used for magnetometry by probing the resonant spin transitions using microwaves (MW) and using optically detected magnetic resonance (ODMR) spectroscopy to measure the magnitude and optionally direction of the applied magnetic field.

NV$^-$ defect in synthetic diamond material can be formed in a number of different ways including:

(i) formation during growth of the synthetic diamond material where a nitrogen atom and a vacancy are incorporated into the crystal lattice as a nitrogen-vacancy pair during growth;

(ii) formation after diamond material synthesis from native nitrogen and vacancy defects incorporated during the growth process by subsequent annealing the material at a temperature (around 800° C.) which causes migration of the vacancy defects through the crystal lattice to pair up with native single substitutional nitrogen defects;

(iii) formation after diamond material synthesis from native nitrogen defects incorporated during the growth process by irradiating the synthetic diamond material to introduce vacancy defects and then subsequently annealing the material at a temperature which causes migration of the vacancy defects through the crystal lattice to pair up with native single substitutional nitrogen defects;

(iv) formation after diamond material synthesis by implanting nitrogen defects into the synthetic diamond material after diamond material synthesis and annealing the material at a temperature which causes migration of the native vacancy defects through the crystal lattice to pair up with implanted single substitutional nitrogen defects; and (v) formation after diamond material synthesis by irradiating the synthetic diamond material to introduce vacancy defects, implanting nitrogen defects into the synthetic diamond material, and annealing the material at a temperature which causes migration of the vacancy defects through the crystal lattice to pair up with implanted single substitutional nitrogen defects.

Formation of NV⁻ defects by nitrogen ion implantation and annealing (optionally including a vacancy generating irradiation step pre- or post-ion implantation) has a number of potential advantages including:

(i) NV⁻ defects in synthetic diamond material used in applications such as nano-magnetometry, wide-field magnetometry, and quantum processing applications typically need to be close to the surface of the synthetic diamond material (within a few nm) and ion implantation is a useful method of providing near surface NV⁻ defects;

(ii) ion implantation and annealing allows NV⁻ defects to be formed at particular lateral locations relative to a synthetic diamond surface by controlling the lateral position of the nitrogen ion implantation as well as controlling the depth of the NV⁻ defects by controlling the energy of the nitrogen ion implantation which is a useful to accurately position NV⁻ defects within structures formed in the synthetic diamond material such as waveguides and photonic structures;

(iii) by controlling the nitrogen implantation dose, along with any vacancy generating irradiation dose, it is possible to introduce a controlled concentration of NV⁻ defects in a particular location within the diamond crystal lattice such as a layer of NV⁻ defects having a particular concentration and located a particular depth relative to a surface of the synthetic diamond material;

(iv) as the position and concentration of NV⁻ defects formed by implantation and annealing is independent of the diamond growth process, it is possible to optimize the diamond growth process to provide a suitable host material in which the NV⁻ defects can subsequently be formed as required, i.e. decoupling the design of the host matrix from the design of the NV⁻ distribution.

Numerous publications have described NV⁻ fabrication in synthetic diamond materials via nitrogen ion implantation and annealing and the use of such materials for sensing and quantum processing applications. For example:

Rabeau et al. and Santori et al. have discussed the dynamics of nitrogen implantation and annealing [see Appl. Phys. Lett. 88, 023113 (2006) and Phys. Rev. B 79, 125313 (2009)];

Steingert et al. have disclosed high sensitivity magnetic imaging by employing ion implantation to create a homogenous layer of negatively charged NV⁻ centres into an ultrapure {100} type IIa diamond [see Review of Scientific Instruments 81, 043705 (2010)] spins in diamond";

B. Naydenov et al. have suggested an implantation and annealing technique at a temperature of 800° C. for fabricating NV⁻ spin defects and have further suggested that annealing at higher temperatures above 1000° C., 1100° C., or 1200° C. may be advantageous for removing various paramagnetic defects to increase the decoherence time of NV⁻ spin defects [Applied Physics Letters 97, 242511 (2010)]; and Fu et al. have suggested that annealing NV⁻ containing diamond material at 465° C. in an oxygen atmosphere can oxidize NV⁰ to NV⁻ near the surface of the sample [see Appl. Phys. Lett. 96, 121907 (2010)].

One problem with the formation of near surface NV⁻ defects in synthetic diamond materials via nitrogen ion implantation and annealing is that to date such near surface NV⁻ defects exhibit a shorter spin coherence time than native NV⁻ defects found in the bulk of high purity single crystal CVD diamond material such as the single crystal CVD diamond materials described in WO01/096633, WO2010/010344, and WO2010/010352.

It is an aim of certain embodiments of the present invention to increase the spin coherence time of near surface NV⁻ defects formed in synthetic diamond materials via nitrogen ion implantation and annealing.

SUMMARY OF INVENTION

A method of fabricating a diamond component is described, the method comprising:

growing a single crystal CVD diamond layer having an as-grown growth face, at least a portion of the as-grown growth face having a surface roughness $R_a$ of no more than 100 nm, 80 nm, 50 nm, 20 nm, 10 nm, 5 nm, 2 nm, 1 nm, or 0.5 nm;

implanting nitrogen into said as-grown growth face of the single crystal CVD diamond layer without polishing and without etching of the as-grown growth face; and annealing the single crystal CVD diamond layer to cause migration of vacancy and/or nitrogen defects within the single crystal CVD diamond layer and formation of nitrogen-vacancy defects from the implanted nitrogen and the vacancy defects.

Previously, nitrogen implantation to form nitrogen-vacancy defects in diamond material has been performed through polished surfaces or inductively coupled plasma (ICP) etched surfaces. Both polishing and ICP etching introduces damage into a diamond surface which detrimentally affects the magnetic properties of near surface NV⁻ defects. It has been found that forming nitrogen-vacancy defects by nitrogen implantation into an as-grown growth face of a single crystal CVD diamond layer without any polishing or etching of the as-grown growth face leads to near surface NV⁻ defects have a longer spin coherence times when compared to those formed by implantation into a polished or ICP etched surface of an otherwise equivalent single crystal CVD diamond material.

In addition to the above, it has been found that the CVD growth process for fabricating a single crystal CVD diamond layer can be controlled to achieve a smooth as-grown growth face which is suitable for use in sensing and quantum processing applications without any further polishing or etching. Such a smooth surface can be patterned to form device structures such as waveguides and photonic cavity structures. However, in accordance with embodiments of the present invention at least a portion of the surface adjacent the NV⁻ defects is retained in as-grown form to avoid introducing damage into the diamond lattice around the NV⁻ defects which are to be used in an imaging, sensing or information processing application.

Further to the fabrication method described above, a single crystal CVD diamond component is described, the component comprising:

a surface, wherein at least a portion of said surface is formed of as-grown growth face single crystal CVD diamond material which has not been polished or etched and which has a surface roughness Ra of no more than 100 nm, 80 nm, 50 nm, 20 nm, 10 nm, 5 nm, 2 nm, 1 nm, or 0.5 nm; and a layer of NV⁻ defects, said layer of NV⁻ defects being disposed within 1 μm of the surface, said layer of NV⁻ defects having a thickness of no more than 500 nm, and said layer of NV⁻ defects having a concentration of NV⁻ defects of at least $10^5$ NV⁻/cm².

Such a single crystal CVD diamond component can be fabricated using the methodology as described above and comprises NV⁻ defects which are located within a single crystal CVD diamond material close to a low surface roughness, low surface damage as-grown surface thus providing near surface NV⁻ defects in a defined position with long spin coherence times for nanomagnetometry or other similar devices such as for wide field magnetometry and quantum information processing.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

As described in the summary of invention section, a method of fabricating a diamond component is provided for a quantum imaging, sensing, or information processing device, the method comprising:
growing a single crystal CVD diamond layer having an as-grown growth face, at least a portion of the as-grown growth face having a surface roughness Ra of no more than 100 nm;
implanting nitrogen into said as-grown growth face of the single crystal CVD diamond layer without any polishing or etching of the as-grown growth face; and
annealing the single crystal CVD diamond layer to cause migration of vacancy and/or nitrogen defects within the single crystal CVD diamond layer and formation of nitrogen-vacancy defects from the implanted nitrogen and the vacancy defects.

Figure 1:
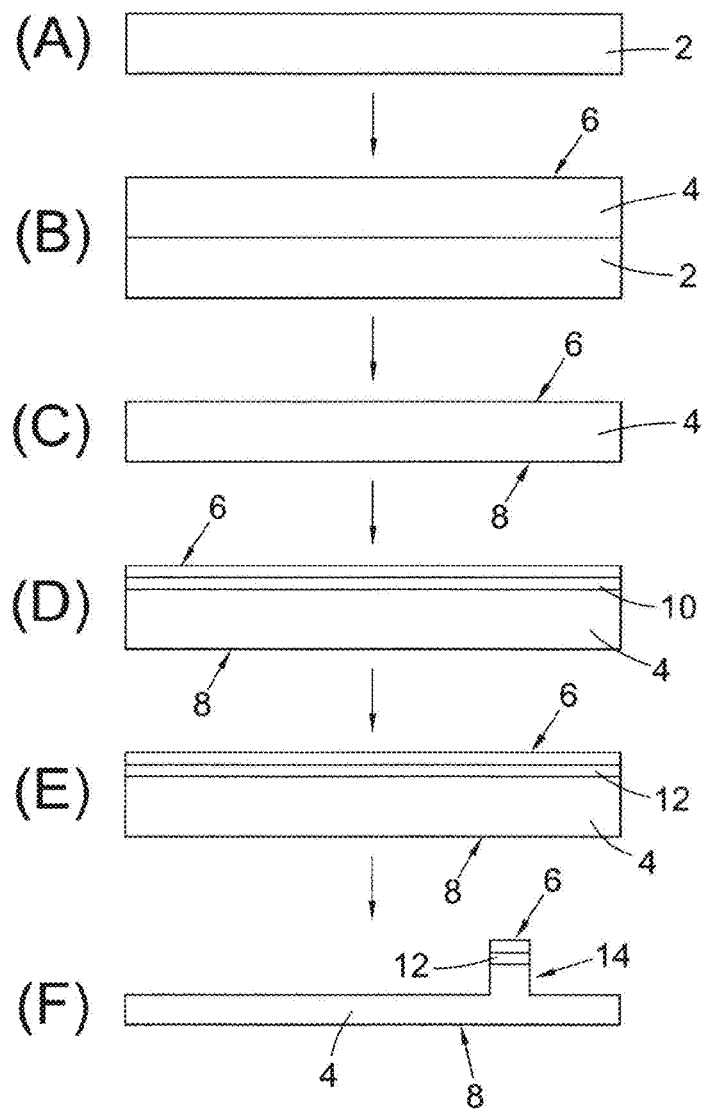
FIGS. 1(A) to 1(F) illustrate the method steps involved in fabricating a single crystal CVD diamond component.

FIG. 1 illustrates the aforementioned method. The starting point (FIG. 1A) is a single crystal diamond substrate 2 which is suitably prepared for single crystal CVD diamond growth thereon.

Next (FIG. 1B), a high purity single crystal CVD diamond layer 4 is grown on the substrate 2 in a similar manner to that described, for example, in WO01/096633, WO2010/010344, and WO2010/010352. The single substitutional nitrogen concentration of the single crystal CVD diamond layer may be no more than 300 ppb, 200 ppb, 100 ppb, 80 ppb, 60 ppb, 40 ppb, 20 ppb, 10 ppb, 5 ppb, or 1 ppb. A high purity single crystal CVD diamond material is desirable to provide a host material which has low background magnetic "noise" into which NV⁻ defects can be introduced via nitrogen implantation and annealing.

While such high purity single crystal CVD diamond material is known in the art, in the present case the growth process is controlled to specifically provide a low surface roughness as-grown growth face 6. The surface roughness $R_a$ of at least a portion of the as-grown growth face 6 may be no more than 80 nm, 50 nm, 20 nm, 10 nm, 5 nm, 2 nm, 1 nm, or 0.5 nm.

In relation to the above, it may be noted that the term "surface roughness $R_a$" (sometimes referred to as "centre line average" or "c.l.a.") refers to the arithmetic mean of the absolute deviation of surface profile from the mean line measured, for example, by stylus profilometer according to British Standard BS 1134 Part 1 and Part 2. The mathematical description of $R_a$ [from "Tribology", I. M. Hutchings, Pub. Edward Arnold, London, 1992, pages 8-9] is:

$$R_a = \frac{1}{L}\int_0^L |y(x)|\,dx$$

In contrast, a surface roughness $R_q$ refers to the root mean square roughness (sometimes also called the "RMS roughness"). Where $R_q$ is referred to, it is typically measured either using a stylus profilometer according to British Standard BS 1134 Part 1 and Part 2, or using a scanning probe instrument, such as an atomic force microscope, over an area of a few µm by a few µm (e.g. 1 µm×1 µm or 2 µm×2 µm); in the case of an $R_q$ being referred to, the $R_q$ is measured using a stylus profilometer unless it is specifically stated that the $R_q$ is measured using a scanning probe instrument. The mathematical description of $R_q$ [from "Tribology", I. M. Hutchings, Pub. Edward Arnold, London, 1992, pages 8-9)] is:

$$R_q = \sqrt{\frac{1}{L}\int_0^L y^2(x)\,dx}$$

For a surface with a Gaussian distribution of surface heights, $R_q=1.25R_a$ [again from "Tribology", I. M. Hutchings, Pub. Edward Arnold, London, 1992, pages 8-9].

In the present case, the surface roughness $R_a$ of the as-grown diamond growth face may be measured, for example, using atomic force microscopy (AFM), and averaged over an area of at least 100 nm², 500 nm², 1 µm², 20 µm², 25 µm², 100 µm², 200 µm², 400 µm², 900 µm², 2500 µm², 10,000 µm², 0.25 mm², or 1 mm².

To synthesize single crystal CVD diamond material with low surface roughness a combination of pre-synthesis substrate preparation and synthesis methods are employed. The substrate is a single crystal diamond substrate that is suitable for use in homoepitaxial diamond synthesis. The substrate is selected and prepared to have a low level of extended defects and a low level of polishing related subsurface damage. The substrate may be a low birefringence type Ia or IIb natural diamond or a low birefringence type Ib or IIa high pressure/high temperature (HPHT) synthetic diamond or a substrate that has be grown using CVD techniques and then vertically cut (i.e. parallel to the original growth direction) to minimise extended defects breaking the surface of the substrate.

The term "low birefringence" is used to describe a substrate which has at least one of the following properties:

a) a density of extended defects as characterised by X-ray topography of about 1000 per cm² or less over an area of about 0.014 cm² or more;
b) an optical isotropy of about $1 \times 10^{-4}$ or less over a volume of about 0.1 mm³ or greater; and
c) a FWHM ("Full Width at Half Maximum") X-ray rocking curve width for the (004) reflection of about 120 arc seconds or less.

Preferably, the diamond substrate has an extremely low level of birefringence. In diamond, birefringence is typically associated with the presence of large numbers of extended defects (e.g. dislocations, dislocation bundles and stacking faults) that cause high levels of localised strain and consequently birefringence. Preferably the maximum birefringence evaluated by measurements through the thickness of the substrate over 70%, 80%, 90%, 95%, 98% or more of the area of the growth surface, is $1 \times 10^{-4}$ or less, $5 \times 10^{-5}$ or less, $1 \times 10^{-5}$ or less, $5 \times 10^{-6}$ or less, or $1 \times 10^{-6}$ or less. The birefringence can be evaluated using an instrument such as "Metripol" (Oxford Cyrosystems Ltd., Oxford, UK). It is advantageous to use diamond material of such low birefringence as this reduces the number per unit area of extended defects propagating from the substrate into the homoepitaxial diamond layer during growth of the homoepitaxial diamond layer; such defects may be "decorated" with impurity atoms that can have non-zero nuclear spin and therefore can reduce the decoherence time $T_2$ of nearby quantum spin defects.

Crystal defect density is most easily characterised by optical evaluation after using a plasma etch or chemical etch optimised to reveal the defects (referred to as a "revealing etch"). Two types of crystal defects can be revealed:

(i) Those intrinsic to the substrate material such as dislocations, stacking faults, twin boundaries, etc. In selected synthetic or natural diamond the density of these crystal defects can be 50 defects per mm² or lower with more typical values being $10^2$ defects per mm², whilst in other synthetic of natural single crystal diamond materials the defect density can be $10^6$ defects per mm² or greater.

(ii) Those resulting from polishing including dislocation structures and microcracks in the form of 'chatter tracks' along polishing lines thereby forming a mechanically damaged layer beneath the surface of the substrate.

Polishing methods know in the art, such as scaife or chemical mechanical polishing, may be carefully controlled to prepare the substrate while minimising the level of subsurface damage introduced during processing. Furthermore, the surface of the substrate is advantageously etched in-situ immediately prior to diamond growth thereon.

In order to fabricate smooth as-grown single crystal CVD diamond surfaces it has also been found to be useful to provide a substrate growth surface which is slightly angled relative to a crystallographic plane of the single crystal diamond substrate material. For example, the growth surface may be oriented at an angle of between 0.5° to 5°, 0.5° to 3°, 0.5° to 2°, or 0.5° to 1.5° relative to a crystallographic plane, such as a {100} crystallographic plane, of the single crystal diamond substrate material.

Single crystal CVD diamond growth is performed on a single crystal diamond substrate prepared as described above. Extremely pure $CH_4$ gas is utilized in combination with high purity $H_2$. A low concentration of $CH_4$ within the process gas is preferred (typically approximately 2% of the total gas volume).

Figure 2:
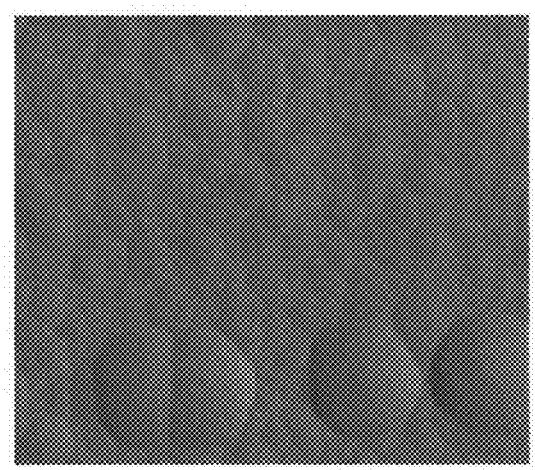
FIGS. 2(A) and 2(B) show differential interference contrast (DIC) microscopy images illustrating surface morphology of as-grown single crystal CVD diamond samples with FIG. 2(A) showing a typical rough as-grown single crystal CVD diamond surface and FIG. 2(B) showing a smooth as-grown single crystal CVD diamond surface using the methodology described herein.
Figure 2:
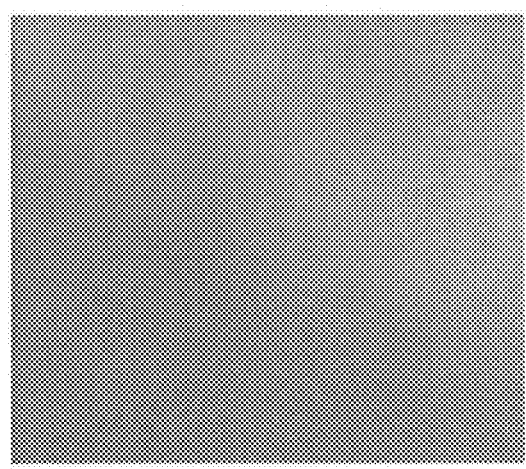
Figure 3:
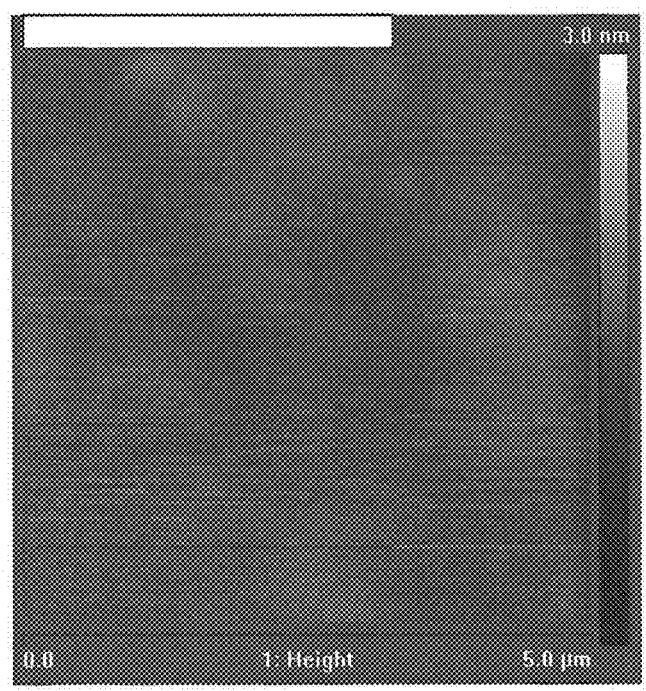
FIG. 3 shows a plot of surface height over a 5×5 µm area of a smooth as-grown surface which has an RMS surface roughness of 0.1 nm.
Figure 4:
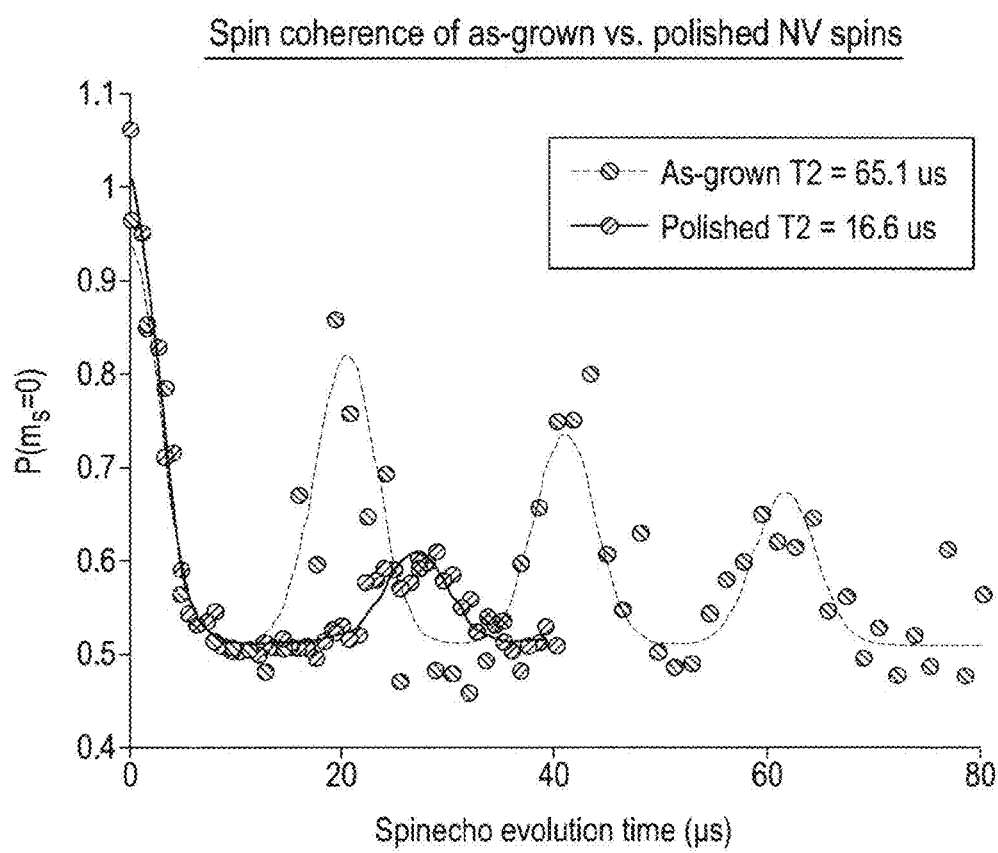
FIG. 4 illustrates the spin coherence of NV⁻ defects formed by implantation into a polished surface of a single crystal CVD diamond layer versus the spin coherence of NV⁻ defects formed by implantation into an as-grown surface of a single crystal CVD diamond layer.

Using a slightly mis-oriented substrate growth surface with low subsurface damage and low birefringence in combination with pre-etching, and CVD diamond synthesis using high purity process gases with a low $CH_4$ concentration, it is possible to grow smooth as-grown single crystal CVD diamond material. FIGS. 2(A) and 2(B) show differential interference contrast (DIC) microscopy images at a magnification of 20× illustrating how surface morphology of the as-grown single crystal CVD diamond material is modified. FIG. 2(A) shows a typical as-grown single crystal CVD diamond surface which comprises surface features thus providing a relatively rough as-grown surface. In contrast, FIG. 2(B) shows an as-grown single crystal CVD diamond surface using the methodology described herein and which is substantially featureless thus providing a very smooth as-grown surface. FIG. 3 shows a plot of surface height over a 5×5 µm area of the smooth as-grown surface which has an RMS surface roughness of 0.1 nm.

After single crystal CVD diamond growth, the layer of single crystal CVD diamond material 4 (FIG. 1C) can be removed from the substrate 2 by cutting, mechanical processing. This yields a high purity single crystal CVD diamond plate 4 with a smooth, low damage, as-grown front surface 6 and a smooth processed rear surface 8 which will include some polishing and/or etching damage to the diamond crystal lattice which is indicative of the polishing and/or etching process used to form the rear surface.

In an alternative method, the layer of high purity single crystal CVD diamond material 4 can be retained on the substrate 2 such that a single crystal plate is provided with a smooth, low damage, as-grown, high purity single crystal CVD diamond front face and a rear face formed of the single crystal diamond growth substrate.

As illustrated in FIG. 1D, nitrogen is then implanted into the as-grown surface 6 of the high purity single crystal CVD diamond plate 4 to form a layer of nitrogen 10 within the high purity single crystal CVD diamond plate 4 near the as-grown surface 6. The implantation energy and dose can be controlled to control the depth, thickness, and concentration of nitrogen within the high purity single crystal CVD diamond plate as is known in the art. The difference here is that implantation is performed into an as-grown diamond surface of low crystal damage and low surface roughness rather than a polished or etched surface which may be smooth but which will inevitably include processing damage of the surface and near surface diamond lattice introducing defects which increase the magnetic noise near the surface of the single crystal CVD diamond plate. Furthermore, factors such as channelling mean that it can be desirable to control the angle of implantation with respect to the orientation of the as-grown crystal face. That is, the nitrogen may be implanted into the as-grown growth face of the single crystal CVD diamond layer at an acute angle relative to the as-grown growth face.

The exact implantation depth and concentration of nitrogen will depend on the required characteristics of the diamond component in an end application. Typically, the nitrogen is implanted into the as-grown growth face of the single crystal CVD diamond layer to a depth of no more than 1 µm, 500 nm, 100 nm, 50 nm, 30 nm, 10 nm or 5 nm. Typically, the implantation dose will be at least $10^5$ N/cm², $10^6$ N/cm², $10^7$ N/cm², $10^8$ N/cm², $10^9$ N/cm², $10^{10}$ N/cm², or $10^{11}$ N/cm² and/or no more than $10^{14}$ N/cm² or $10^{13}$ N/cm². In certain circumstances for reasons of yield, it can be desirable to control the temperature of the diamond material during implantation, for example by heating or cooling the sample during implantation. Furthermore, prior to, or after, implantation the single crystal CVD diamond material can be irradiated, for example with electron irradiation or carbon ions, to form additional vacancy defects within the single crystal CVD diamond material. Such irradiation treatment is known in the art.

In relation to the above, it should be noted that it is not necessary to create a source of nitrogen and vacancies in the diamond material at the same location as the desired end location of nitrogen-vacancy defects which are to be formed within the diamond material. In fact, it can be desirable to implant nitrogen and/or create vacancy defects at a location within the diamond material which is removed from the desired end location of nitrogen-vacancy defects which are to be formed within the diamond material. This is because, implantation and irradiation creates damage within the diamond crystal structure which, if located near nitrogen-vacancy defects, can detrimentally affect the properties of the nitrogen-vacancy defects. Even using an annealing process to remove damage caused by implantation and irradiation some residual defects will remain which can adversely affect properties of the nitrogen-vacancy defects such as decoherence time $T_2$. For example, it can be desirable to implant nitrogen at a different location within the diamond material to that which is irradiated to form vacancy defects. The material may then be heated to cause diffusion of the vacancy defects to the implanted nitrogen defects to form nitrogen-vacancy defects while minimizing crystal damage in the region where the nitrogen-vacancy defects are formed. Furthermore, charge donor defects, such as single substitutional nitrogen, which donate charge to nitrogen-vacancy defects to form $NV^-$ defects may also be separated from nitrogen-vacancy defects within the diamond material as described in WO2012/152617.

After nitrogen implantation, and optional vacancy generating irradiation, the single crystal CVD diamond material is annealed to cause migration of vacancy defects within the single crystal CVD diamond layer and formation of a nitrogen-vacancy defect layer 12 (FIG. 1E) from the implanted nitrogen and the vacancy defects. It is known that nitrogen-vacancy defects form at around 800° C. As such, the annealing comprises an annealing step at a temperature in a range 700 to 900° C. for at least 2 hours, 4 hours, 6 hours, or 8 hours. It has also been suggested that treatment at a higher temperature can be advantageous for removing various paramagnetic defects which decrease the decoherence time of $NV^-$ spin defects. Accordingly, the annealing may comprise a further annealing step at a temperature in a range 1150° C. to 1550° C. for at least 2 hours, 4 hours, 6 hours, or 8 hours. For example, the further annealing step may be performed at a temperature of at least 1200° C., 1300° C., or 1350° C. and/or a temperature of no more than 1500° C., 1450° C., or 1400° C. In addition, prior to the aforementioned annealing steps, an initial annealing step may be performed at a temperature in a range 350 to 450° C. for at least 2 hours, 4 hours, 6 hours, or 8 hours.

Such a multi-stage annealing process has been found to significantly improve the spin coherence time, emission line width, and spectral stability of spin defects within a diamond matrix which is already of high purity and relatively low strain. While not being bound by theory, the reasoning behind why this multi-stage annealing process is successful is as follows.

Annealing diamond material changes the nature and distribution of defects within the diamond lattice. For example, multi-atom defects can be split, defects can become mobile and move through the diamond lattice, and defects can combine to form new defect types. The temperature at which these different processes occur varies and will also be dependent on the type of impurities within the diamond lattice. In high purity CVD synthetic diamond materials the defect structure is dominated by nitrogen containing defects and vacancy containing defects. Nitrogen is predominantly in the form of isolated nitrogen atoms which may be located on lattice sites or in interstitial locations. Vacancies are present in isolated form, as di-vacancies, and as larger vacancy clusters and chains.

A first annealing step at a temperature in a range 350 to 450° C. for at least 2 hours (optionally at least 4, 6, or 8 hours) is intended to move interstitial nitrogen and carbon atoms from interstitial sites to lattice sites. This requires interstitial nitrogen and carbon atoms to combine with vacancy defects present on lattice sites such that the vacancy is replaced with a nitrogen or carbon atom on the lattice site. It is believed that an annealing temperature of around 400° C. is optimal for achieving this process for eliminating interstitial nitrogen and carbon defects compared with a process, for example, in which interstitial nitrogen defects combine to form interstitial-interstitial di-nitrogen or nitrogen-interstitial defects which may remain at higher annealing temperatures when nitrogen-vacancy defects are formed. That is, at temperatures around 400° C. it is believed that the main loss mechanism for interstitial nitrogen atoms is to combine with vacancies on lattice sites rather than forming more stable di-nitrogen interstitial and/or nitrogen-interstitial defects. While 2 hours is believed to be sufficient time to remove or significantly reduce interstitial nitrogen atom at a temperature around 400° C., a longer annealing time of at least 4, 6, or 8 hours may be desirable to ensure that this is the case.

Once interstitial nitrogen and carbon defects have been removed (or at least reduced) by the aforementioned annealing step, a second annealing step at a temperature in a range 700 to 900° C. is performed for at least 2 hours (optionally at least 4, 6, or 8 hours). This step is intended to cause the formation of NV defects by migrating vacancies to combine with nitrogen atoms located on lattice sites. At temperatures much less than 800° C. it is believed that the vacancies are not sufficiently mobile to form NV defects in a reasonable time frame. At temperatures significantly above 800° C. it is believed that the greater thermal energy in the diamond lattice means the strain field around the isolated nitrogen defects is no longer sufficient to lead to it being the dominant loss mechanism for vacancies migrating through the diamond lattice. For example, at 1200° C. very few NV defects are formed while at temperatures significantly above 1400° C. the nitrogen atoms located on lattice sites become mobile in the presence of vacancy defects which is also undesirable. While 2 hours is believed to be sufficient time to convert a significant number of vacancies into NV defects via a migration and capture mechanism at a temperature around 800° C., there is some evidence to suggest that a significant concentration of vacancy defects remains after annealing for 2 hours. Accordingly, a longer annealing time of at least 3 hours, 4 hours, 5 hours, 6 hours, 8 hours, or 10 hours at a temperature around 800° C. may be desirable to ensure that a significant concentration of residual vacancy defects does not remain present within the diamond lattice.

Finally, it is believed that in addition to the formation of NV defects at 800° C., the other main loss mechanism for isolated vacancies at this temperature is to form di-vacancy defects. Di-vacancy defects anneal out at temperatures above 1150° C. and thus a third annealing step is performed at a temperature above 1150° C. for at least 2 hours (optionally at least 4, 6, or 8 hours), in order to remove di-vacancy defects. In addition, it is believed that intrinsic sp$^2$ carbon type defects and hydrogen begin to migrate or anneal out at around 1200° C. Accordingly, it may be advantageous to perform the third annealing step at a higher temperature of at least 1200° C., 1300° C., or 1350° C. As previously indicated, at temperatures significantly above 1400° C. it is believed that nitrogen atoms located on lattice sites become mobile in the presence of vacancy defects and thus it is considered that it may be advantageous to ensure that the third annealing step does not significantly exceed 1400° C. although it can be possible to use a temperature up to 1550° C. if the second annealing step is performed for a sufficiently long time period such that there are very few vacancies thus making nitrogen atoms less mobile. As such, the third annealing step may be performed at a temperature of at least 1200° C., 1300° C., or 1350° C. and/or a temperature of no more than 1500° C., 1450° C., or 1400° C. While 2 hours is believed to be sufficient time to remove or significantly reduce di-vacancies, hydrogen and intrinsic sp$^2$ carbon defects, a longer annealing time of at least 3 hours, 4 hours, 6 hours, or 8 hours may be desirable to ensure that a significant concentration of residual di-vacancy defects, hydrogen, and sp$^2$ carbon defects does not remain present within the diamond lattice.

In relation to the above, it should be noted that high annealing temperatures can lead to graphitisation of the diamond material. Accordingly, high temperature annealing steps may be performed under an inert atmosphere and/or under diamond stabilizing pressure to prevent graphitisation. Furthermore, after performing the multi-stage annealing process the synthetic diamond material is advantageously acid cleaned and then oxygen plasma ashed or annealed in oxygen to remove any residual graphite.

The above described methodology can thus be combined to manage the forms of impurity with a crystal lattice while also avoiding damage to the crystal lattice caused by surface processing techniques.

As a final step in the method illustrated in FIG. 1F, the as-grown growth face 6 of the single crystal CVD diamond layer 4 can be processed at selected regions only to form device structures therein with one or more regions of said surface being retained in as-grown form. An example structure which is suitable for nano-magnetometry is illustrated in the final step of FIG. 1. The component is formed of a high purity single crystal CVD diamond material 4 with a projection 14 extending from the main body of the component to form a sensing tip. The end of the sensing tip provides a sensing surface formed of a low surface roughness, as grown growth face of the single crystal CVD diamond material 6. One or more NV$^-$ defects 12 are located in the sensing tip 14 within close proximity to the sensing surface 6.

An alternative method is to fabricate a single crystal diamond substrate into a desired geometry including device surface structures, overgrow the surface structures with a layer of single crystal CVD diamond material, and then implant nitrogen into the as-grown layer of single crystal CVD diamond material and anneal as previously described. That is, rather than forming device structures after diamond growth, nitrogen implantation and annealing, the single crystal CVD diamond layer may be grown on a single crystal diamond substrate which already has device structures formed therein. In this case, only a thin layer of single crystal CVD diamond material may be grown such that the exposed surface of the thin layer of single crystal CVD diamond material retains the morphology of the underlying device structure formed in the single crystal diamond substrate.

The aforementioned methodology is thus capable of fabricating a single crystal CVD diamond component comprising NV$^-$ defects which are located within a high purity single crystal CVD diamond material close to a low surface roughness, low surface damage as-grown diamond surface thus providing near surface NV$^-$ defects in a defined position with long spin coherence times for nano-magnetometry or other similar devices such as wide field magnetometry and QIP devices.

As such, there is provided a single crystal CVD diamond component for imaging, sensing, or quantum information processing, the single crystal CVD diamond component comprising:

a surface, wherein at least a portion of said surface is formed of as-grown growth face single crystal CVD diamond material which has not been polished or etched and which has a surface roughness Ra of no more than 100 nm, 80 nm, 50 nm, 20 nm, 10 nm, 5 nm, 2 nm, 1 nm, or 0.5 nm; and a layer of NV$^-$ defects, said layer of NV$^-$ defects being disposed within 1 μm, 500 nm, 200 nm, 100 nm, 50 nm, 30 nm, 10 nm, or 5 nm of the surface, said layer of NV$^-$ defects having a thickness of no more than 500 nm, 200 nm, 100 nm, 50 nm, 30 nm, 10 nm or 5 nm, and said layer of NV$^-$ defects having a concentration of NV$^-$ defects of at least $10^5$ NV$^-$/cm$^2$, $10^6$ NV$^-$/cm$^2$, $10^7$ NV$^-$/cm$^2$, $10^8$ NV$^-$/cm$^2$, $10^9$ NV$^-$/cm$^2$, $10^{10}$ NV$^-$/cm$^2$, $10^{11}$ NV$^-$/cm$^2$, or $10^{12}$ NV$^-$/cm$^2$ and/or no more than $10^{14}$ NV$^-$/cm$^2$ or $10^{13}$ NV$^-$/cm$^2$.

The area of the portion of the component surface which is formed of as-grown growth face single crystal CVD diamond material having said surface roughness Ra may be at least 100 nm$^2$, 500 nm$^2$, 1 μm$^2$, 20 μm$^2$, 25 μm$^2$, 100 μm$^2$, 200 μm$^2$, 400 μm$^2$, 900 μm$^2$, 2500 μm$^2$, 10,000 μm$^2$, 0.25 mm$^2$, or 1 mm$^2$.

The single crystal CVD diamond component may also comprise a layer having a single substitutional nitrogen concentration of no more than 300 ppb, 200 ppb, 100 ppb, 80 ppb, 60 ppb, 40 ppb, 20 ppb, 10 ppb, 5 ppb, or 1 ppb, said layer being disposed distal to the as-grown surface relative to the layer of NV$^-$ defects.

As illustrated in FIG. 1F, such a component may comprise a projection 14 with an outermost surface of the projection 6 being formed of the as-grown growth face single crystal CVD diamond material.

While the above definition specifies a diamond component with two distinct layers including a near surface NV$^-$ layer and a rear high purity layer, there will also be a very thin region of diamond material immediately adjacent the as-grown surface which also remains high purity after implantation and annealing. In some configurations, this surface layer may be so thin that it is difficult to take a measurement of the nitrogen content of the layer. However, if the surface layer is measurable then it can be stated that the layer disposed proximal to the front surface relative to the layer of NV$^-$ defects may also have has a single substitutional nitrogen concentration of no more than 300 ppb, 200 ppb, 100 ppb, 80 ppb, 60 ppb, 40 ppb, 20 ppb, 10 ppb, 5 ppb, or 1 ppb.

While the front surface of the component is formed from the as-grown growth face of the single crystal CVD diamond material, a rear surface of the single crystal CVD diamond component will comprise polished or etched single crystal CVD diamond material. For many quantum sensing and processing application it is advantageous for the component to be in the form of a thin plate. For example, the single crystal CVD diamond component may have a thickness of no more than 300 µm, 200 µm, 100 µm, 80 µm, or 60 µm and/or a thickness of no less than 2 nm, 5 nm, 10 nm, 100 nm, 1 µm, 10 µm, 20 µm, 30 µm, or 40 µm. Furthermore, for many applications it is advantageous for the component to have a reasonable lateral size. For example, the single crystal CVD diamond component may have at least one lateral dimension of at least 0.5 mm, 1 mm, 2 mm, 3 mm, 4 mm, 4.5 mm, or 5 mm.

The single crystal CVD diamond component may comprise structural features which have nano-scale dimensions, e.g. nano-rings, nano-channels (e.g. microfluidics), nano-beams or nano-pillars patterned on a larger substrate. For certain applications these features may be overgrown with another layer of diamond material. That is, a further single crystal CVD diamond layer may be grown over the as-grown growth face after implanting nitrogen. As such, it will be apparent that the as-grown surface of the single crystal diamond material may either form an external surface of the final single crystal CVD diamond component or an internal surface of the single crystal CVD diamond component between two layers of single crystal CVD diamond material.

The location of the $NV^-$ defects near a low damage, as-grown surface in combination with the annealing techniques as described herein can result in the formation of near surface $NV^-$ defects have a spin coherence time $T_2$ at room temperature of at least 50, 65, 85, 100, 150, 200, 400, 800, or 1000 µs. FIG. 2 illustrates the spin coherence of near surface $NV^-$ defects formed by implantation into a polished surface of a single crystal CVD diamond layer versus the spin coherence of near surface $NV^-$ defects formed by implantation into an as-grown surface of a single crystal CVD diamond layer according to an embodiment of the present invention. The spin coherence time $T_2$ for the $NV^-$ defects formed by implantation into a polished surface is only 16.6 µs whereas the spin coherence time $T_2$ for the $NV^-$ defects formed by implantation into a low roughness, low damage, as-grown surface is 65.1 µs. It is expected that much higher near surface $NV^-$ spin coherence times will be achieved with further optimizations of this methodology. For example, it is known that reducing the concentration of $^{13}C$ within a diamond lattice increases the $T_2$ time of $NV^-$ defects disposed within the diamond lattice. As such, in a further embodiment of the present invention the single crystal CVD diamond component will be fabricated with isotopically purified source gases to yield a component with a $^{13}C$ concentration of no more than 1%, 0.8%, 0.6%, 0.4%, 0.2%, 0.1%, 0.05%, or 0.01% in at least the layer of $NV^-$ defects. This should lead to a further increase in the $T_2$ time of the near surface $NV^-$ defects.

In addition to the above, combining the use of implantation into smooth as-grown surfaces and the annealing techniques as described herein enables the formation of near surface $NV^-$ defects with narrow zero phonon line width emission. For example, the $NV^-$ defects may have a full width half maximum intrinsic inhomogeneous zero phonon line width of no more than 100 MHz, 80 MHz, 60 MHz, 50 MHz, or 40 MHz.

In this regard it should be noted that the inhomogeneous zero phonon line width is distinct from the instantaneous zero phonon line width. Emission line broadening over time is known in the art as inhomogeneous line broadening and the overall total spectral line width measured over time is known as the inhomogeneous line width. This contrasts with a line width measured at a specific instance in time known as the single scan line width. The term intrinsic inhomogeneous zero phonon line width is used here to relate to the inhomogeneous zero phonon line width of the spin defect with no photonic cavity broadening and with no Stark tuning to counteract spectral drift. The measured full width half maximum intrinsic inhomogeneous zero phonon line width may be averaged over at least 10, 20, 30, 50, 75, 100, 500, or 1000 seconds and/or over at least 10, 20, 30, 50, 75, 100, 500, or 1000 spectral scans.

While this invention has been particularly shown and described with reference to embodiments, it will be understood by those skilled in the art that various changes in form and detail may be made without departing from the scope of the invention as defined by the appending claims.

The invention claimed is:

1. A single crystal chemical vapour deposited (CVD) diamond component comprising:
a surface, wherein at least a portion of said surface is formed of as-grown growth face single crystal CVD diamond material which has not been polished or etched and which has a surface roughness $R_a$ of no more than 100 nm; and
a layer of $NV^-$ defects, said layer of $NV^-$ defects being disposed within 1 µm of the surface, said layer of $NV^-$ defects having a thickness of no more than 500 nm, and said layer of $NV^-$ defects having a concentration of $NV^-$ defects of at least $10^5$ $NV/cm^2$.

2. The single crystal CVD diamond component according to claim 1,
wherein the surface roughness $R_a$ is no more than 80 nm.

3. The single crystal CVD diamond component according to claim 1,
wherein the portion of the surface which has said surface roughness $R_a$ has an area of at least 100 $nm^2$.

4. The single crystal CVD diamond component according to claim 1,
wherein the surface comprises a projection with an outermost surface of the projection being formed of the as-grown growth face single crystal CVD diamond material.

5. The single crystal CVD diamond component according to claim 1,
wherein the layer of $NV^-$ defects is disposed within 500 nm of the surface.

6. The single crystal CVD diamond component according to claim 1,
wherein the thickness of the layer of $NV^-$ defects is no more than 200 nm.

7. The single crystal CVD diamond component according to claim 1,
wherein the concentration of $NV^-$ defects in the layer of $NV^-$ defects is at least $10^6$ $NV^-/cm^2$ and no more than $10^{14}$ $NV^-/cm^2$.

8. The single crystal CVD diamond component according to claim 1, wherein the $NV^-$ defects in the layer of $NV^-$ defects have a spin coherence time $T_2$ at room temperature of at least 50 µs.

9. The single crystal CVD diamond component according to claim 1,
wherein the $NV^-$ defects in the layer of $NV^-$ defects have a full width half maximum intrinsic inhomogeneous zero phonon line width of no more than 100 MHz.

10. The single crystal CVD diamond component according to claim 9,
wherein the full width half maximum intrinsic inhomogeneous zero phonon line width is averaged over at least 10 seconds.

11. The single crystal CVD diamond component according to claim 9,
wherein the full width half maximum intrinsic inhomogeneous zero phonon line width is averaged over at least 10 spectral scans.

12. The single crystal CVD diamond component according to claim 1,
further comprising a layer having a single substitutional nitrogen concentration of no more than 300 ppb, said layer being disposed distal to the surface relative to the layer of NV⁻ defects.

13. The single crystal CVD diamond component according to claim 1,
wherein a layer disposed proximal to the surface relative to the layer of NV⁻ defects has a single substitutional nitrogen concentration of no more than 300 ppb.

14. The single crystal CVD diamond component according to claim 1,
wherein the surface roughness $R_a$ is no more than 20 nm.

15. The single crystal CVD diamond component according to claim 1,
wherein the portion of the surface which has said surface roughness $R_a$ has an area of at least 1 mm².

16. The single crystal CVD diamond component according to claim 1,
wherein the concentration of NV⁻ defects in the layer of NV⁻ defects is at least $10^9$ NV⁻/cm² and no more than $10^{14}$ NV⁻/cm².

17. A method of fabricating the single crystal CVD diamond component according to claim 1, the method comprising:
growing a single crystal CVD diamond layer having an as-grown growth face, at least a portion of the as-grown growth face having a surface roughness $R_a$ of no more than 100 nm;
implanting nitrogen into said as-grown growth face of the single crystal CVD diamond layer without polishing and without etching the as-grown growth face; and
annealing the single crystal CVD diamond layer to cause migration of vacancy and/or nitrogen defects within the single crystal CVD diamond layer and formation of nitrogen-vacancy defects from the implanted nitrogen and the vacancy defects.

18. The method according to claim 17,
further comprising processing of the as-grown growth face of the single crystal CVD diamond layer at selected regions only to form device structures therein with one or more regions of said surface being retained in as-grown form.

* * * * *